(12) United States Patent
Morita et al.

(10) Patent No.: US 7,489,212 B2
(45) Date of Patent: Feb. 10, 2009

(54) MICRORESONATOR, BAND-PASS FILTER, SEMICONDUCTOR DEVICE, AND COMMUNICATION APPARATUS

(75) Inventors: Shinya Morita, Kanagawa (JP); Takashi Kinoshita, Kanagawa (JP); Masahiro Tanaka, Kanagawa (JP); Masahiro Tada, Kanagawa (JP); Shun Mitarai, Kanagawa (JP)

(73) Assignee: Sony Corporation, Tokyo (JP)

( * ) Notice: Subject to any disclaimer, the term of this patent is extended or adjusted under 35 U.S.C. 154(b) by 303 days.

(21) Appl. No.: 11/425,080

(22) Filed: Jun. 19, 2006

(65) Prior Publication Data
US 2007/0001784 A1    Jan. 4, 2007

(30) Foreign Application Priority Data
Jun. 29, 2005  (JP)  ............... 2005-190269

(51) Int. Cl.
*H03H 9/54* (2006.01)
*H03H 3/02* (2006.01)
(52) U.S. Cl. ...................................... 333/186
(58) Field of Classification Search .......... 333/186–192
See application file for complete search history.

(56) References Cited

U.S. PATENT DOCUMENTS 7,095,298 B2 * 8/2006 Song et al. .................. 333/187
2007/0171001 A1 * 7/2007 Naniwada et al. ........... 333/186

FOREIGN PATENT DOCUMENTS

JP    2004-328076    11/2004

* cited by examiner

*Primary Examiner*—Daniel D Chang
(74) *Attorney, Agent, or Firm*—Sonnenschein Nath & Rosenthal LLP (57) ABSTRACT

A microresonator includes a beam-type resonator element in which a beam that is an oscillating portion of the resonator element has a high-resistance portion or an insulating portion.

9 Claims, 11 Drawing Sheets

MICRORESONATOR, BAND-PASS FILTER, SEMICONDUCTOR DEVICE, AND COMMUNICATION APPARATUS

CROSS REFERENCES TO RELATED APPLICATIONS

The present invention contains subject matter related to Japanese Patent Application JP 2005-190269 filed in the Japanese Patent Office on Jun. 29, 2005, the entire contents of which being incorporated herein by reference.

BACKGROUND OF THE INVENTION

1. Field of the Invention

The present invention relates to a microresonator including a beam-type resonator element that is electrostatically driven, a band-pass filter including this microresonator, a semiconductor device including this microresonator, and a communication apparatus that uses a band-pass filter based on this microresonator.

2. Description of the Related Art

With progress in wireless communication technology in recent years, there has been demand for size reduction and weight reduction in a communication apparatus that uses wireless communication technology. Micro-electro-mechanical-system (MEMS) technology, which employs microprocessing technology used for a semiconductor to manufacture a micro mechanical structure, has been used for an RF signal processing portion where size reduction has been hitherto considered to be difficult. As an example thereof, there is a mechanical filter using mechanical resonance, which is expected to be applied to a communication field, because size is small and integration is possible.

Figure 1A:
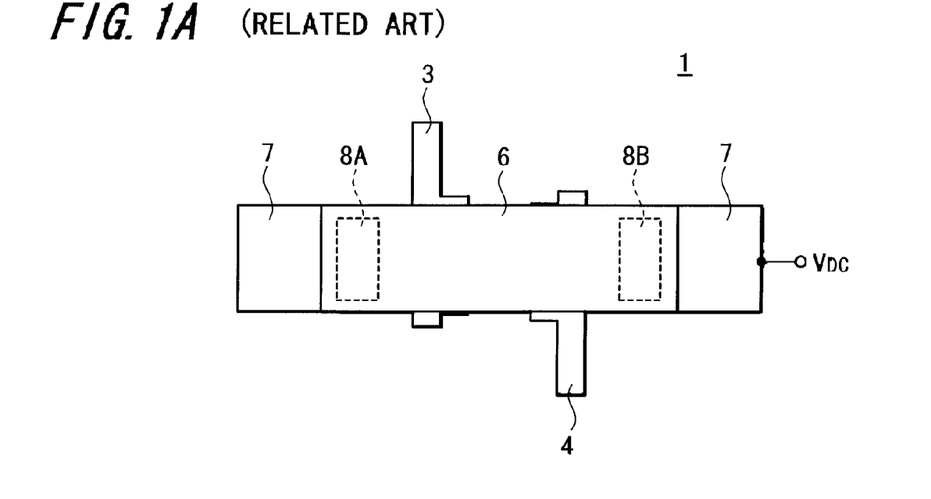
FIGS. 1A and 1B are a plan view and a cross-sectional view showing an example of an electrostatically driven beam-type resonator element in related art.
Figure 1B:
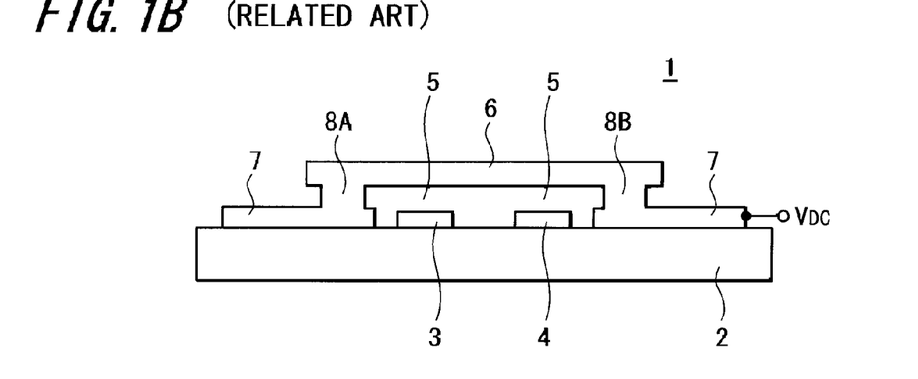

Japanese Published Patent Application No. 2004-328076 discloses a beam-type microresonator element that is electrostatically driven, as a mechanical resonator element constituting a filter. As shown in FIGS. 1A and 1B, a microresonator element 1 is configured such that an input electrode 3 and an output electrode 4 that are lower electrodes are formed on a substrate 2 having at least an insulating surface. Further, an electrode to be an oscillating portion, that is, a beam 6 is formed opposing those input electrode 3 and output electrode 4 across a space 5. The input electrode 3 and the output electrode 4 are formed to intersect the lengthwise direction of the beam 6. The beam 6 straddles the input and output electrodes 3, 4 in the manner of a bridge and is integrally supported at both ends by support portions (anchor portions) 8 [8A, 8B] to be connected to wiring layers 7 disposed outside the input and output electrodes 3, 4. A necessary DC bias voltage $V_{DC}$ is applied to the beam 6 through the wiring layer 7.

In this microresonator element 1, based on a signal input from the input electrode 3, the beam 6 oscillates at a specific resonance frequency, because the beam 6 receives external force caused by electrostatic force generated between the beam 6 to which a DC bias voltage $V_{DC}$ is applied and the input electrode 3. This oscillation is transmitted as a signal to the output electrode 4 through the micro space 5.

SUMMARY OF THE INVENTION

When a mechanical filter is formed by using the microresonator element 1, a microresonator including individual microresonator elements 1 arranged in parallel is used. In a band-pass filter, filter characteristics can be obtained by interconnecting two resonators having different resonance frequencies which are determined according to pass bands thereof.

Figure 16:
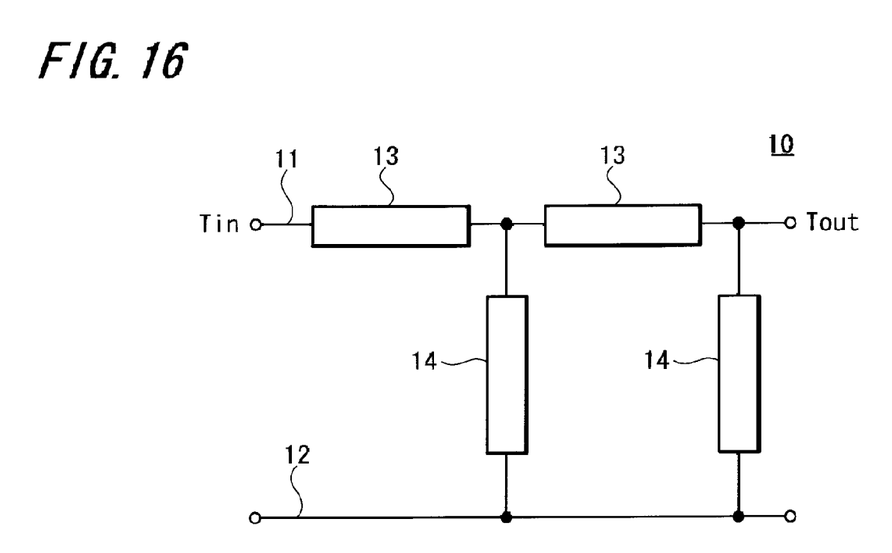
FIG. 16 is a circuit diagram showing an example of a ladder-type filter.

When a band-pass filter is formed by combining resonators, a ladder-type, for example, and the like are known as a method of combining the resonators. As shown in FIG. 16, a band-pass filter of the ladder-type is configured as follows. A series resonator 13 including a resonator element that has a high resonance frequency is connected in series to a signal line 11. Further, a shunt resonator 14 similarly including a resonator element that has a low resonance frequency is connected between the signal line 11 on the output side of this series resonator 13 and a ground line 12. FIG. 16 shows a ladder-type filter 10 of a two-stage configuration.

Figure 18:
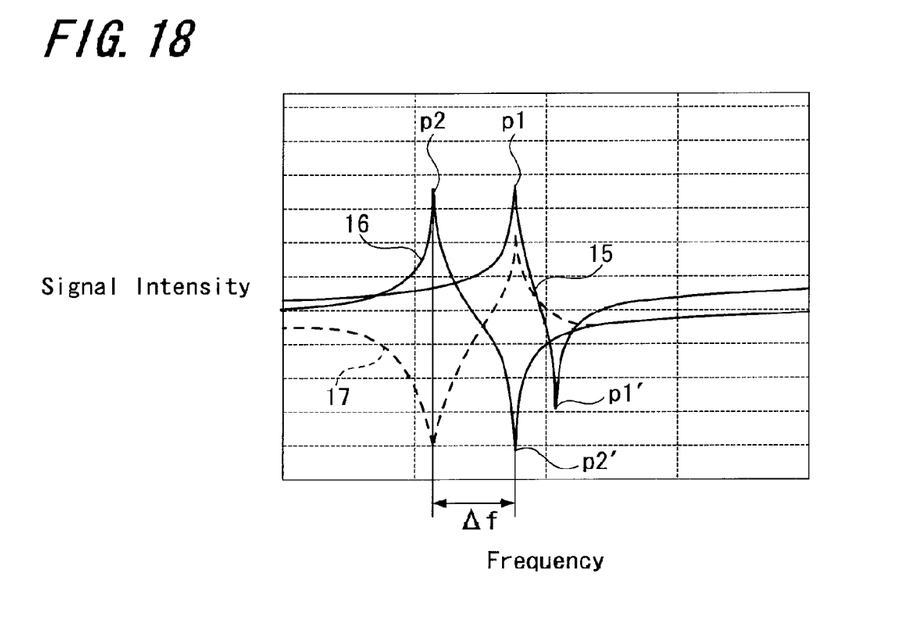
FIG. 18 is a characteristic diagram showing frequency characteristics of a series resonator and a shunt resonator constituting a ladder-type filter.
Figure 19:
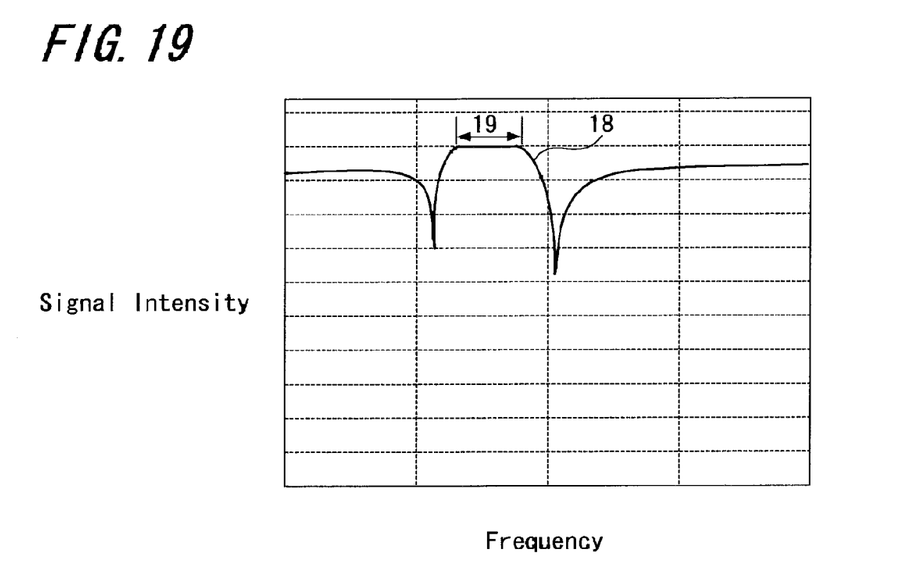
FIG. 19 is a characteristic diagram showing a filter characteristic (frequency characteristic) of a ladder-type filter.

A filter characteristic of this ladder-type filter 10 is obtained as follows. As shown in FIG. 18, an output waveform 15 having a resonance peak p1 at a high frequency is obtained in the series resonator 13 and an output waveform 16 having a resonance peak p2 at a low frequency is obtained in the shunt resonator 14. On the other hand, an output waveform becomes the one denoted by a reference numeral 17 when a signal is input after connecting the shunt resonator 14 between the signal line 11 and the ground line 12. As a result, a frequency characteristic of the ladder-type filter 10 is obtained as a waveform in which the output waveform 17 and the output waveform 15 of the series resonator 13 are added up. Specifically, a waveform 18 of the filter characteristic shown in FIG. 19 is obtained.

The waveform 18 of an excellent filter characteristic is obtained when a frequency of the resonance peak p1 of the series resonator 13 and a frequency of an anti-resonance peak p2' of the shunt resonator 14 are the same. In this ladder-type band-pass filter, a wide bandwidth 19 (refer to FIG. 19) can be obtained by widely setting a frequency difference Δf between the resonance peak p2 and anti-resonance peak p2' of the shunt resonator 4.

Figure 2:
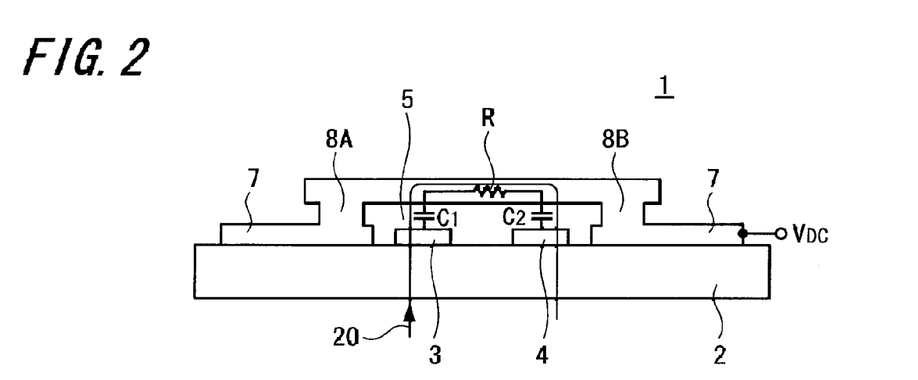
FIG. 2 is an explanatory view provided for explaining a signal leak in a resonator element.

However, the microresonator including the above-described beam-type resonator element 1 has large parasitic capacitance C1 between the input electrode 3 and the beam 6, and large parasitic capacitance C2 between the output electrode 4 and the beam 6 due to the structural reasons. Because of the above, it is difficult to widely set the frequency difference Δf between the resonance peak p2 and anti-resonance peak p2', and therefore it has been difficult to broaden the bandwidth 19 of the band-pass filter. Specifically, in case of a beam-type resonator, as shown in FIG. 2, there is a signal path 20 electrically formed through resistance R of the beam portion, parasitic capacitance C1 between the input electrode 3 and the beam 6, and parasitic capacitance C2 between the output electrode 4 and the beam 6, in addition to a signal path formed through a mechanical oscillation of the beam. Leak signals carried in this path 20 are irrelevant to the resonance of the beam and may lower S/N of the resonator. Since the space 5 between the input and output electrodes 3, 4 of the lower electrodes and the beam 6 is narrow in this microresonator, the parasitic capacitance C1 between the input electrode 3 and the beam 6 and parasitic capacitance C2 between the output electrode 4 and the beam 6 are large, and the signal leaks flowing through the parasitic capacitance C1, C2 become large. Due to the above, it is difficult to widely set the frequency difference Δf between the resonance peak and anti-resonance peak, when the band-pass filter is designed by using the microresonator, and accordingly it has been difficult to obtain a band-pass filter whose bandwidth is broadened.

In order to suppress the above-described signal leaks, it is conceivable that the parasitic capacitance C1 between the input electrode 3 and the beam 6 and parasitic capacitance C2 between the output electrode 4 and the beam 6 are reduced, or the resistance R of the beam portion is increased. In order to reduce the parasitic capacitance C1, C2, it is necessary to increase the space 5 between the beam 6 and the signal line (namely, the input electrode 3 and the output electrode 4). However, as a result, electromechanical conversion efficiency between the signal line and the beam 6 is reduced, and the performance is lowered. When resistance R of the beam 6 itself is increased, oscillation by electrostatic force may not be obtained, because electric charges to generate the oscillation by applying the DC bias voltage $V_{DC}$ to the beam 6 are not collected sufficiently.

In view of the above, it is desirable to provide a microresonator that can reduce signal leaks through parasitic capacitance between input and output signals.

Further, it is desirable to provide a band-pass filter of a wide bandwidth using this microresonator, a semiconductor device including this microresonator, and a communication apparatus including the band-pass filter based on this microresonator.

A microresonator according to an embodiment of the present invention includes a beam-type resonator element in which a beam that is an oscillating portion of the resonator element has a high-resistance portion or an insulating portion.

A band-pass filter according to an embodiment of the present invention includes a microresonator which has a beam-type resonator element in which a beam that is an oscillating portion of the resonator element has a high-resistance portion or an insulating portion.

A semiconductor device according to an embodiment of the present invention includes a microresonator which has a beam-type resonator element in which a beam that is an oscillating portion of the resonator element has a high-resistance portion or an insulating portion.

A communication apparatus according to an embodiment of the present invention is a communication apparatus provided with a filter which performs band limiting of transmission signals and/or reception signals, wherein, as the filter, a filter based on a microresonator which includes a beam-type resonator element in which a beam that is an oscillating portion of this resonator element has a high-resistance portion or an insulating portion is used.

The microresonator according to an embodiment of the present invention has the high-resistance portion or the insulating portion in the beam of the resonator element, and so signal leaks through parasitic capacitance between input and output signals can be reduced. Hence, the frequency difference between a resonance peak and anti-resonance peak can be widely set, and a band-pass filter of a wide bandwidth can be obtained when this microresonator is applied to the band-pass filter, for example.

The band-pass filter according to an embodiment of the present invention uses the microresonator in which the signal leaks through the parasitic capacitance between the input and output signals are reduced, and so the frequency difference between the resonance peak and anti-resonance peak can be widely set, and a band-pass filter of a wide bandwidth can be provided.

The semiconductor device according to an embodiment of the present invention includes the microresonator in which the signal leaks through the parasitic capacitance between the input and output signals are reduced, and so the semiconductor device having an excellent characteristic can be provided.

The communication apparatus according to an embodiment of the present invention uses, as a band-pass filter, the filter based on the microresonator in which the signal leaks through the parasitic capacitance between the input and output signals are reduced, and so the communication apparatus that has an excellent filter characteristic of the wide bandwidth and other excellent characteristics can be obtained. Accordingly, a highly reliable communication apparatus can be provided.

DESCRIPTION OF THE PREFERRED EMBODIMENTS

Hereinafter, embodiments of the present invention are explained by referring to the accompanied drawings.

A microresonator element constituting a microresonator used in the following embodiments is an element of micro-scale and nano-scale.

Figure 3A:
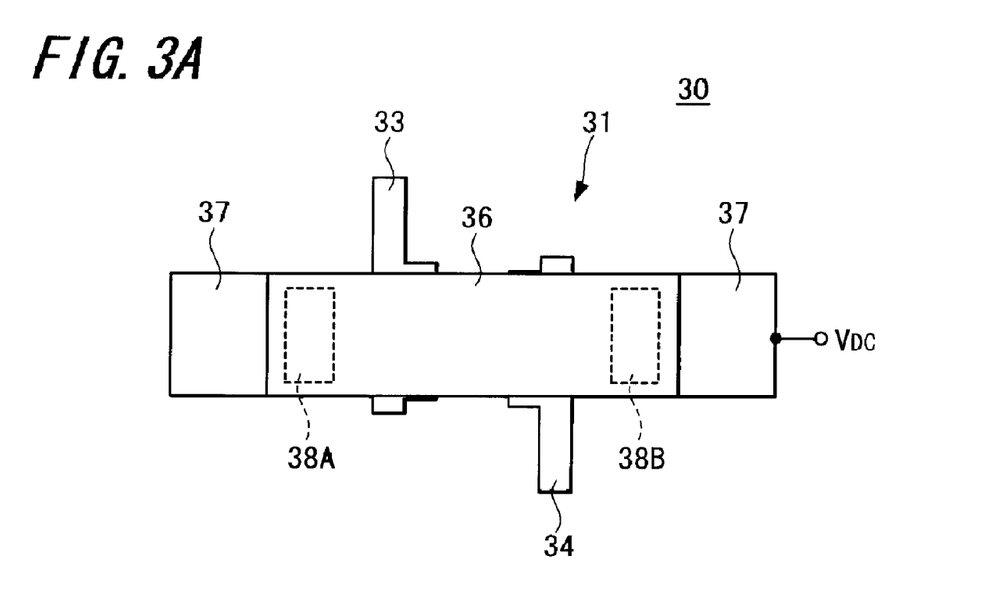
FIGS. 3A and 3B are a plan view and a cross-sectional view showing a microresonator according to an embodiment of the present invention.
Figure 3B:
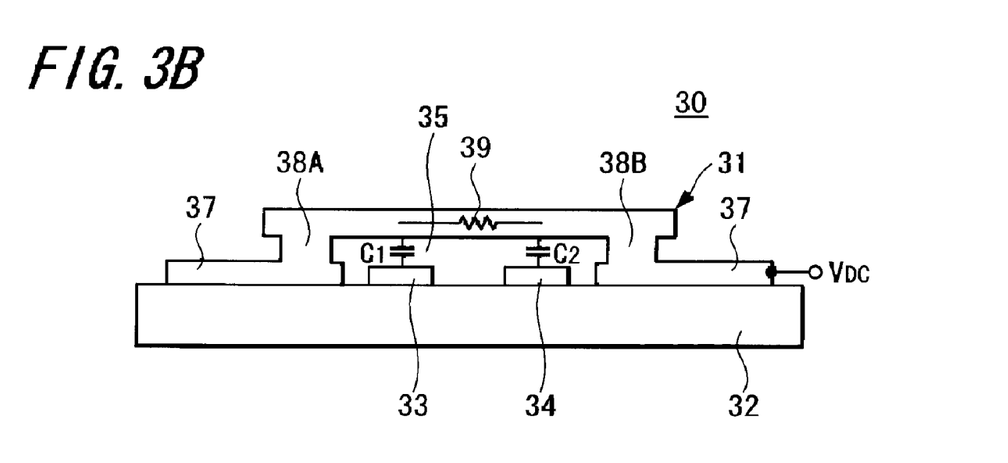

FIGS. 3A and 3B show an embodiment of a microresonator according to the present invention. First, a single microresonator element constituting a microresonator 30 is explained. In a microresonator element 31 according to this embodiment, an input electrode 33 and an output electrode 34 which are lower electrodes are formed on a substrate 32 having at least an insulating surface. Further, an electrode which is an oscillating portion, that is, a beam 36 is formed opposing those input electrode 33 and output electrode 34 across a space 35. The input electrode 33 and the output electrode 34 are formed to intersect the lengthwise direction of the beam 36. The beam 36 straddles the input and output electrodes 33, 34 in the manner of a bridge and is integrally supported at both ends by support portions (anchor portions) 38 [38A, 38B] to be connected to wiring layers 37 disposed outside the input and output electrodes 33, 34. A predetermined DC bias voltage $V_{DC}$ is applied to the beam 36.

Further, in this embodiment, resistance component distribution 39 of the beam 36 that is the oscillating portion is controlled to reduce signal leaks that flow between the input and output electrodes 33, 34 through parasitic capacitance of the oscillating portion, specifically, through the parasitic capacitance C1 between the input electrode 33 and the beam 36 and parasitic capacitance C2 between the output electrode 34 and the beam 36.

The microresonator 30 according to this embodiment is configured to have one or a plurality of combined microresonator elements 31 having the above-described structure. For example, a plurality of microresonator elements 31 are arranged in parallel to form the microresonator 30.

Similarly to the above, operation of the microresonator element 31 of this embodiment is performed as follows. The beam 36 receives external force caused by electrostatic force generated between the beam 36 to which a DC bias voltage $V_{DC}$ is applied and the input electrode 33 based on a signal that is input from the input electrode 33, and the beam 36 oscillates at a specific resonance frequency. This oscillation is transmitted as a signal to the output electrode 34 through the micro-space 35.

According to the above-described microresonator 30 of this embodiment, signal leaks that flow through the parasitic capacitance C1, C2 of the oscillating portion can be reduced by controlling the resistance component distribution 39 of the beam 36 in the microresonator element 31, specifically, can be reduced by increasing part of resistance of the beam 36. As a result, S/N of the resonator 30 is improved. Accordingly, when a band-pass filter, for example, is designed by using this microresonator 30, a frequency difference between a resonance peak and anti-resonance peak can be set widely and a band-pass filter having a filter characteristic of a wide bandwidth can be obtained.

As a structure that enables the beam 36 to have the resistance component distribution for controlling the signal leaks, a portion of the beam 36 corresponding to an interval between the input electrode 33 and the output electrode 34 may be formed with resistance higher than that of the other portion of the beam 36 or may be formed with insulating material, for example.

Further, a portion of the beam 36 corresponding to a node of an oscillation mode can be formed with high-resistance or insulating material.

Further, the beam 36 can be formed with a plurality of materials each having different resistivity. Furthermore, the beam 36 can be formed of a plurality of regions whose impurity concentrations are different.

Moreover, the beam 36 may include at least two layers in which an upper layer and a part of the bottom layer continuous thereto is formed with high-resistance or insulating material.

Figure 4A:
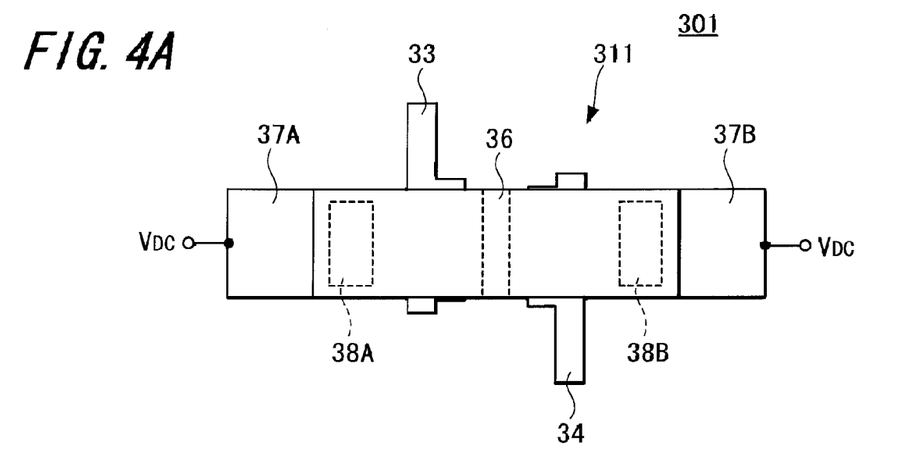
FIGS. 4A and 4B are a plan view and a cross-sectional view showing a microresonator according to a first embodiment of the present invention.
Figure 4B:
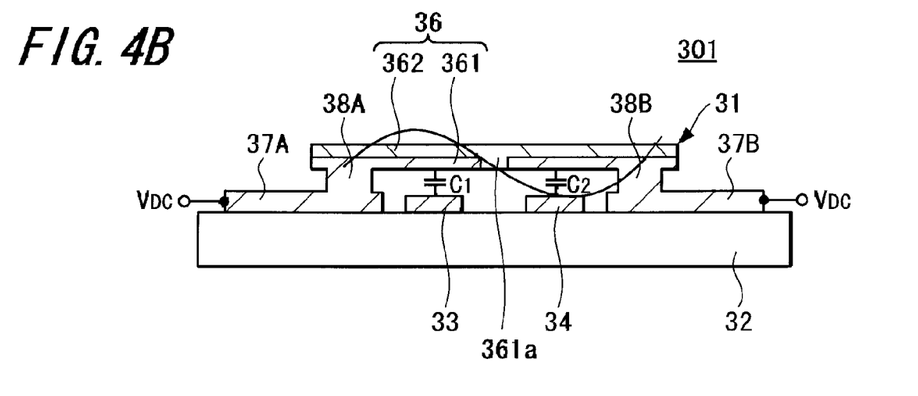

FIGS. 4A and 4B show a microresonator according to a first embodiment of the present invention. A microresonator 301 of this embodiment is configured to have a microresonator element 311 of a second-order oscillation mode, and a beam 36 of the microresonator element 311 is formed of a two-layer film including a first layer film 361 and a second layer film 362. The first layer film 361 which is a lower layer opposing the input and output electrodes 33, 34 is formed of a low-resistance (in other words, conductive) polysilicon film having a high impurity concentration, for example. The second layer film 362 which is an upper layer is formed of a high-resistance polysilicon film having a low impurity concentration, or is formed of a non-doped polysilicon film (practically, an insulating material), for example. In this embodiment, the first layer film 361 is divided in two at the center of the beam 36, specifically, at a portion corresponding to a node of the second-order oscillation mode, and a portion 361a (that is a node) between the divided portions of this first layer film 361 is formed of the same material as the second layer film 362. A DC bias voltage $V_{DC}$ is applied to the beam 36 through wiring layers 37 [37A, 37B] at both ends of the beam 36. Since the other configuration is similar to FIG. 3, the same reference numerals are given to corresponding portions and duplicated explanations thereof are omitted.

According to the microresonator 301 of the first embodiment, since the center portion 361a of the first layer film 361 of the beam 36 is formed with high-resistance or insulating material, signal leaks through the parasitic capacitance C1, C2 are suppressed. The difference between the resonance peak and anti-resonance peak of the resonator becomes large. Also, since the portions (of the first layer film 361) of the beam 36, which oppose the input and output electrodes 33, 34, have conductivity, the DC bias voltage $V_{DC}$ is applied thereto and the portions are excellently resonated by electrostatic force.

Figure 5:
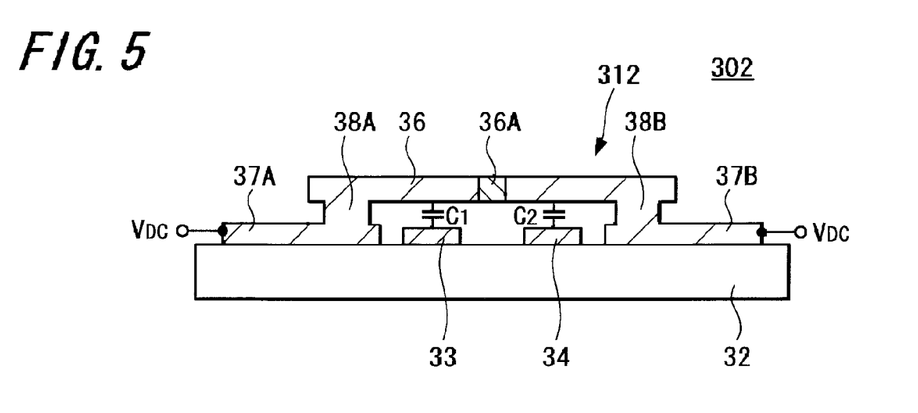
FIG. 5 is a cross-sectional view of a microresonator according to a second embodiment of the present invention.

FIG. 5 shows a microresonator according to a second embodiment of the present invention. A microresonator 302 of this embodiment is configured to have a microresonator element 312 of a second-order oscillation mode. A beam 36 of the microresonator element 312 is formed of a conductive polysilicon film having a high impurity concentration, for example, and a center portion (a portion corresponding to a node of the oscillation mode) 36a is formed of a high-resistance polysilicon film having a low impurity concentration or is formed of an insulating material made of a non-doped polysilicon film, for example. A DC bias voltage $V_{DC}$ is applied to the beam 36 through wiring layers 37 [37A, 37B] at both ends of the beam 36. Since the other configuration is similar to FIG. 3, the same reference numerals are given to corresponding portions and duplicated explanations thereof are omitted.

According to the microresonator 302 of the second embodiment, since the center portion 36a of the beam 36 becomes high-resistance or insulating material, signal leaks through the parasitic capacitance C1, C2 are suppressed. The difference between the resonance and anti-resonance peaks of the resonator becomes large. Also, since the portions of the beam 36 opposing the input and output electrodes 33, 34 have the conductivity, the DC bias voltage $V_{DC}$ is applied thereto and the portions are excellently resonated by electrostatic force. Furthermore, there is such an advantage that impurity concentration of the beam 36 can be controlled by ion implantation at the time of manufacturing.

Figure 6:
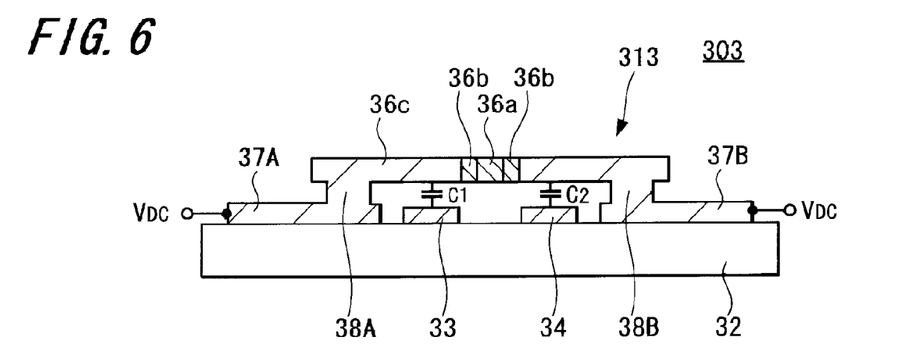
FIG. 6 is a cross-sectional view of a microresonator according to a third embodiment of the present invention.

FIG. 6 shows a microresonator according to a third embodiment of the present invention. A microresonator 303 of this embodiment is configured to have a microresonator element 313 of a second-order oscillation mode, and a beam 36 of the microresonator element 313 is formed of materials of different resistivity. In this embodiment, the beam 36 is formed of a polysilicon film caused to have impurity concentration distribution. Specifically, the beam 36 is formed of, for example, a conductive polysilicon film 36c (region A) having a high impurity concentration, for example. Further, a center portion of the beam 36 (a portion corresponding to a node of the second-order oscillation mode) is formed of a high-resistance polysilicon film 36b (region B) and a more high-resistance polysilicon film 36a (region C) such that the impurity concentration becomes lower toward the center. The polysilicon film 36a at the center can also be formed using non-doped material. A DC bias voltage $V_{DC}$ is applied to the beam 36 through wiring layers 37 [37A, 37B] at both ends of the beam 36. Since the other configuration is similar to FIG. 3, the same reference numerals are given to corresponding portions and duplicated explanations thereof are omitted.

According to the microresonator 303 of the third embodiment, since the beam 36 is formed to have the impurity concentration distribution and resistivity of the center portions (portions corresponding to the node) 36a and 36b of the beam 36 is changed, specifically, the portions are made to have higher resistance or to be insulated, signal leaks through the parasitic capacitance C1, C2 are suppressed. The difference between the resonance and anti-resonance peaks of the resonator becomes large. In addition, since the portions of the beam 36 opposing the input and output electrodes 33, 34 have conductivity, a DC bias voltage $V_{DE}$ is applied thereto and the portions are excellently resonated by electrostatic force. Furthermore, there is such an advantage that the impurity concentration of the beam 36 can be controlled by ion implantation at the time of manufacturing.

Figure 7:
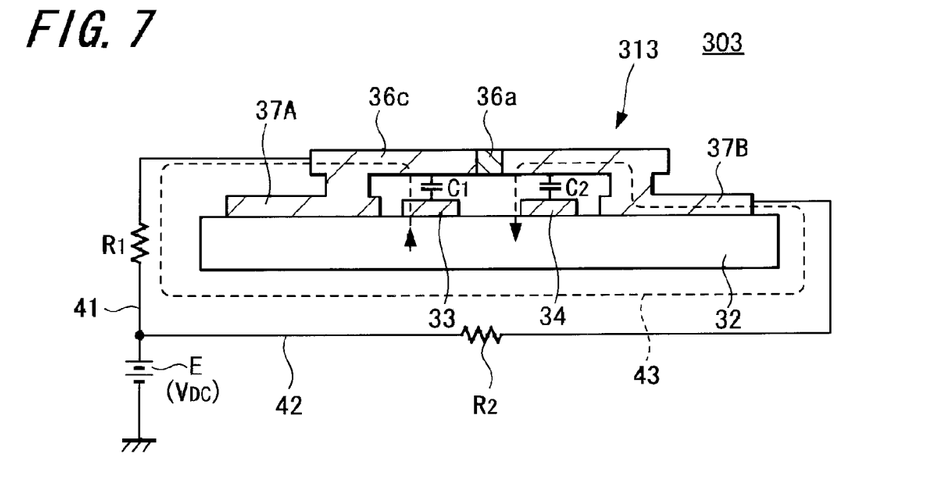
FIG. 7 is a constitutional diagram showing a microresonator according to another embodiment of the present invention.

Here, as shown in FIG. 7, when the DC bias voltage $V_{DC}$ is applied from the both ends of the beam 36, wiring is branched from one power source E into branch wirings 41 and 42, through which the voltage $V_{DC}$ is supplied. At this time, when the wiring is simply branched, there is a possibility that signal leaks occur as shown by a broken line 43. Therefore, for preventing the signal leaks, it is desirable to insert necessary resistances R1 and R2 into the branch wirings 41 and 42, respectively.

Figure 8:
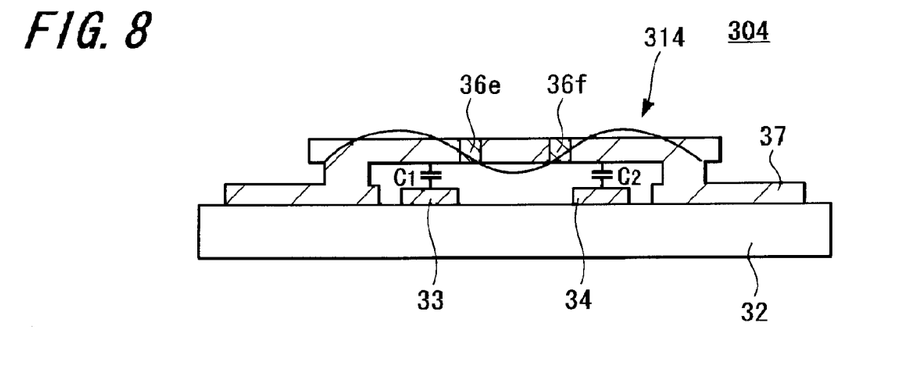
FIG. 8 is a cross-sectional view of a microresonator according to a fourth embodiment of the present invention.

FIG. 8 shows a microresonator according to a fourth embodiment of the present invention. A microresonator 304 of this embodiment is configured to have a microresonator element 314 of a third-order oscillation mode. The input electrode 33 and output electrode 34 of this microresonator element 314 are formed apart from each other, and portions 36e and 36f of the beam 36 corresponding to nodes of the third-order oscillation mode are formed of a high-resistance polysilicon film having a low impurity concentration or of an insulating material made of a non-doped polysilicon film, for example. The other portion of the beam 36 than the portions 36e and 36f corresponding to the nodes is formed of a conductive polysilicon film having a high impurity concentration. A DC bias voltage $V_{DC}$ is applied to the conductive portion of the beam 36. Since the other configuration is similar to FIG. 3, the same reference numerals are given to corresponding portions and duplicated explanations thereof are omitted.

According to the microresonator 304 of the fourth embodiment, since the portions 36e and 36f of the beams 36 corresponding to the nodes in the third-order oscillation mode are formed with high-resistance or insulating material, signal leaks through the parasitic capacitance C1, C2 are suppressed. The difference between the resonance and anti-resonance peaks of the resonator becomes large. In addition, since the portions of the beam 36 opposing the input and output electrodes 33, 34 have conductivity, the DC bias voltage $V_{DC}$ is applied thereto and the portions are excellently resonated by electrostatic force.

Figure 9:
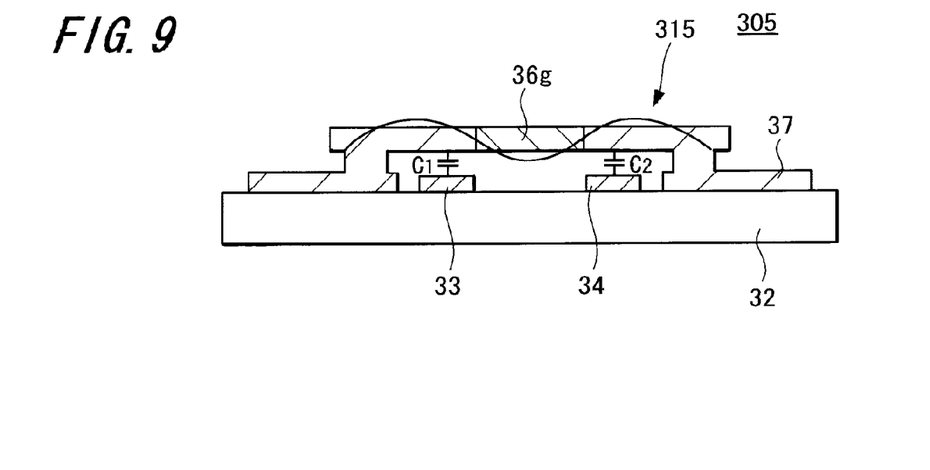
FIG. 9 is a cross-sectional view of a microresonator according to a fifth embodiment of the present invention.

FIG. 9 shows a microresonator according to a fifth embodiment of the present invention. A microresonator 305 of this embodiment is configured to have a microresonator element 315 of a third-order oscillation mode. The input electrode 33 and output electrode 34 of this microresonator element 314 are formed apart from each other. Further, the whole of a portion 36g of the beam 36, which corresponds to the interval between the input and output electrodes 33, 34 including two nodes of the third-order oscillation mode, is formed of a high-resistance polysilicon film having a low impurity concentration or is formed of insulating material made of a non-doped polysilicon film, for example. The other portion of the beam 36 is formed of a conductive polysilicon film having a high impurity concentration. A DC bias voltage $V_{DC}$ is applied to the conductive portion of the beam 36. Since the other configuration is similar to FIG. 3, the same reference numerals are given to corresponding portions and duplicated explanations thereof are omitted.

According to the microresonator 305 of the fifth embodiment, since the whole of the portion 36g of the beam 36 between the two nodes is formed with high-resistance or insulating material, signal leaks through the parasitic capacitance C1, C2 are suppressed. The difference between the resonance and anti-resonance peaks of the resonator becomes large. In addition, since the portions of the beam 36 opposing the input and output electrodes 33, 34 have conductivity, the DC bias voltage $V_{DC}$ is applied thereto and the portions are excellently resonated by electrostatic force.

Figure 10A:
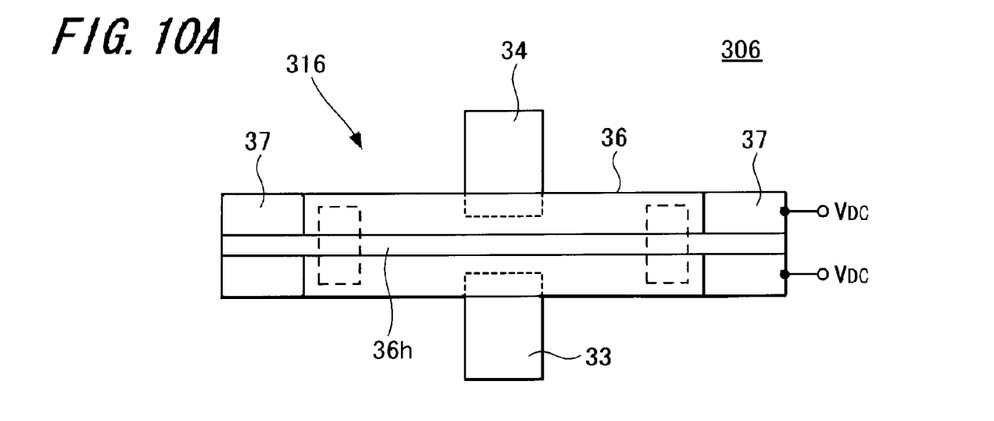
FIGS. 10A and 10B are a plan view and a cross-sectional view of a microresonator according to a sixth embodiment of the present invention.
Figure 10B:
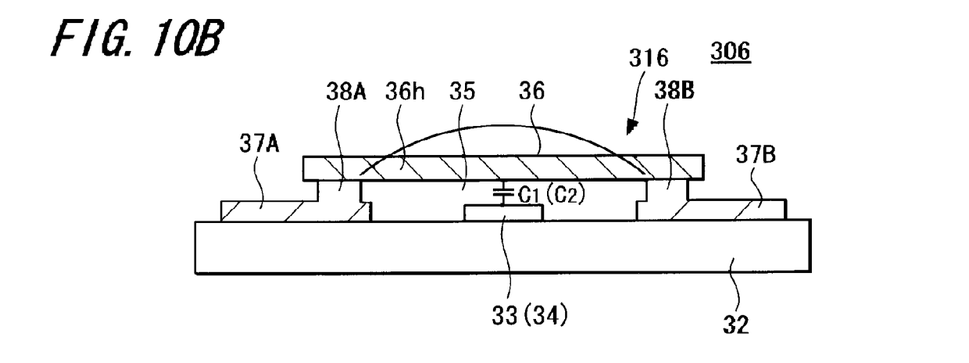

FIGS. 10A and 10B show a microresonator according to a sixth embodiment of the present invention. A microresonator 306 of this embodiment is configured to have a microresonator element 316 of a first-order oscillation mode. This microresonator element 316 is configured such that the input electrode 33 and output electrode 34 of lower electrodes are formed on a substrate 32 to face each other with a predetermined interval in between, and a beam 36 is disposed in a manner opposing the input and output electrodes 33, 34 across a space 35. The beam 36 is disposed such that the lengthwise direction between support portions 37A and 37B becomes orthogonal to the direction in which the input and output electrodes 33, 34 are faced. Further, a center portion 36h along the lengthwise direction of the beam 36 is formed with high-resistance or insulating material. A DC bias voltage $V_{DC}$ is applied to a conductive portion of the beam 36.

Also in the microresonator 306 of the sixth embodiment, since the center portion 36h of the beam 36 corresponding to the interval between the input and output electrodes 33, 34 is formed with high-resistance or insulating material, signal leaks through the parasitic capacitance C1, C2 are suppressed. The difference between the resonance and anti-resonance peaks of the resonator becomes large. In addition, since the portions of the beam 36 opposing the input and output electrodes 33, 34 have conductivity, the DC bias voltage $V_{DC}$ is applied thereto and the portions are excellently resonated by electrostatic force.

Figure 11:
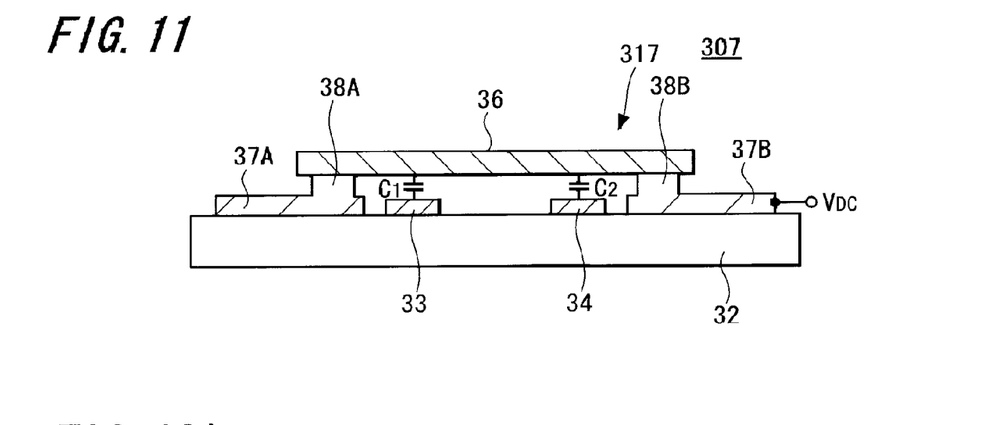
FIG. 11 is a cross-sectional view of a microresonator according to a seventh embodiment of the present invention.

FIG. 11 shows a microresonator according to a seventh embodiment of the present invention. A microresonator 307 according to this embodiment is configured such that impurity concentration of a beam 36 is uniformly reduced in a microresonator element 317 in order to increase the resistance of the beam. In this case, resistivity of the beam 36 is selected to be a level with which signal leaks through the parasitic capacitance C1, C2 can be suppressed and the beam oscillates when applying a DC bias voltage $V_{DC}$. Since the other configuration is similar to FIG. 3, the same reference numerals are given to corresponding portions and duplicated explanations thereof are omitted.

When the structure of the microresonator 307 according to this seventh embodiment is used, signal leaks through the parasitic capacitance can be suppressed without complicated production processes of the resonator. In this case also, similar effectiveness to the above-described embodiments can be obtained by using high-resistance material for the whole beam 36.

Figure 12A:
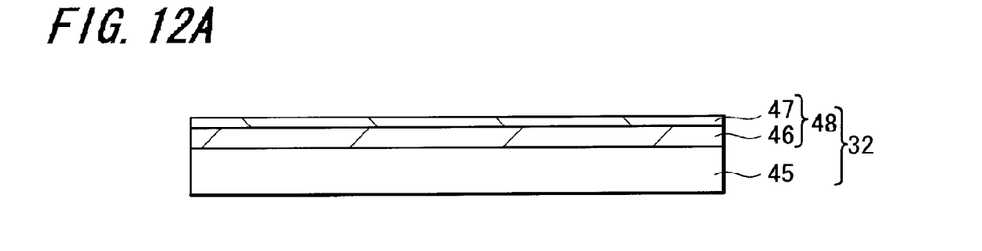
FIGS. 12A through 12C are manufacturing process diagrams (first part) showing a method of manufacturing a microresonator according to an embodiment of the present invention.
Figure 12B:
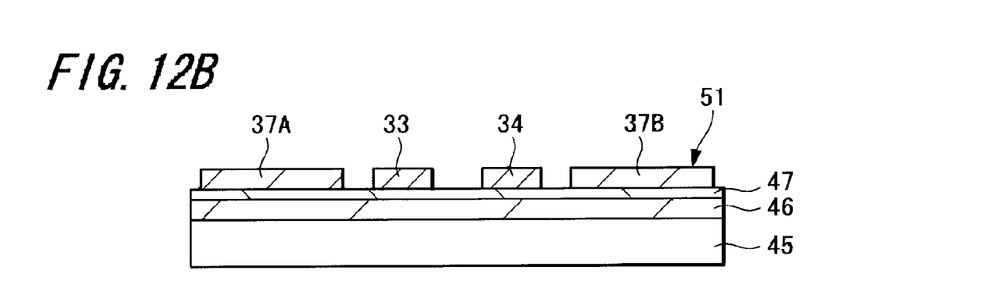
Figure 12C:
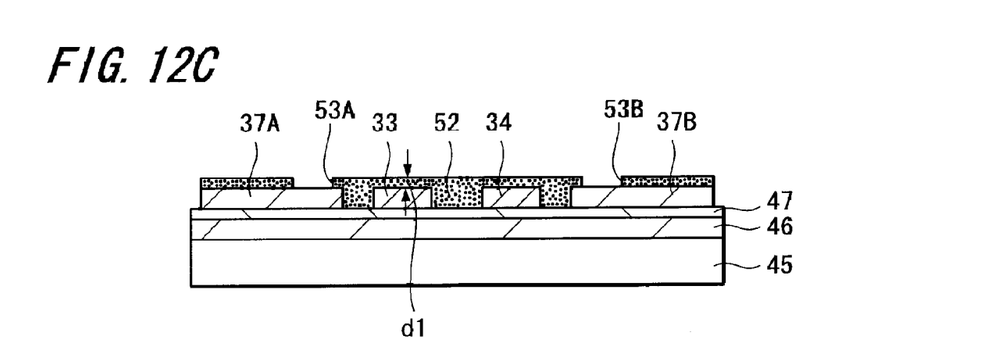
Figure 13A:
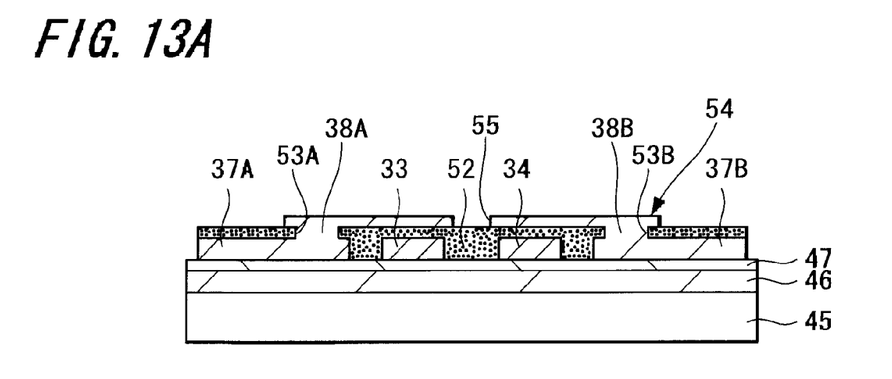
FIGS. 13A through 13C are manufacturing process diagrams (second part) showing a method of manufacturing a microresonator according to an embodiment of the present invention.
Figure 13B:
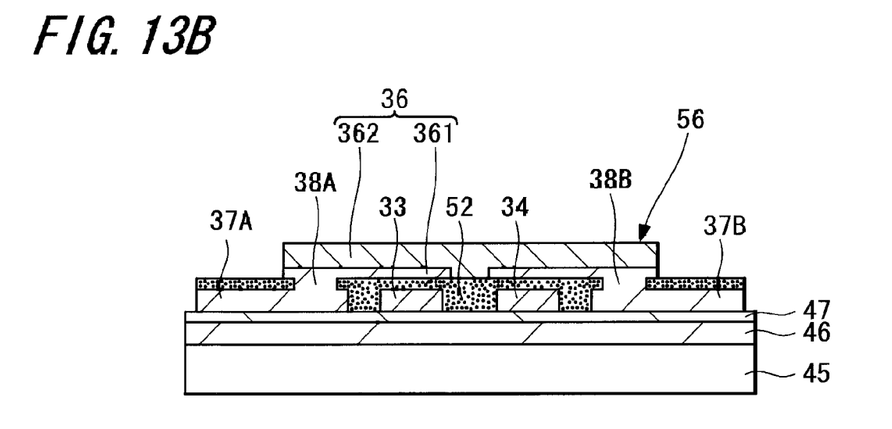
Figure 13C:
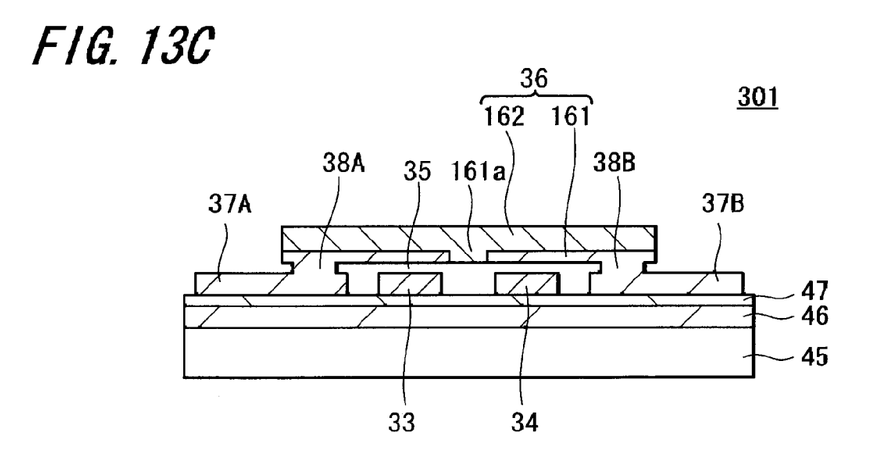

Next, an embodiment of a method of manufacturing a microresonator according to the present invention is explained referring to FIGS. 12 and 13. This embodiment is a case that the microresonator 301 of the first embodiment shown in FIG. 4 is manufactured.

First, as shown in FIG. 12A, reduced-pressure CVD is used to deposit a silicon oxide film ($SiO_2$) 46 and plasma CVD is used to deposit a silicon nitride film (SiN) 47, to form an insulating film 48 on a main surface of a high-resistance silicon substrate 45. A substrate 32 is formed of the high-resistance silicon substrate 45 and the insulating film 48.

Next, as shown in FIG. 12B, reduced-pressure CVD is used to form a conductive polysilicon film 51 doped with a high impurity concentration on the insulating film 48. After that, lithography technology and etching technology are used to pattern the polysilicon film 51, to form the input electrode 33 and output electrode 34 that become lower electrodes, and the wiring layers (drive electrodes) 37 [37A, 37B].

Next, as shown in FIG. 12C, a sacrifice layer 52, a silicon oxide film ($SiO_2$) for example, is formed by reduced-pressure CVD on a substrate surface including the input electrode 33 and output electrode 34 that become the lower electrodes, and the wiring layers 37 [37A, 37B]. After that, openings 53 [53A, 53B] are formed by selectively patterning the sacrifice layer 52 at portions to become support portions of the beam. The thickness d1 of the sacrifice layer 52 on the input electrode 33, the output electrode 34 and the wiring layers 37 is equivalent to the thickness of the cavity portion (space) 35 between the lower electrodes and the beam (refer to FIG. 5).

Next, as shown in FIG. 13A, reduced-pressure CVD is used to form a low-resistance polysilicon film 54 (doped with a high impurity concentration to have conductivity) that becomes the beam, on the sacrifice layer 52 including the inside of the openings 53A and 53B. Then, the polysilicon film 54 is patterned to make a beam shape. At this time, the polysilicon film 54 is patterned such that the beam shape is divided in two and an opening 55 is formed at the center portion corresponding to the interval between the input electrode 33 and the output electrode 34. At the same time, the support portions 38A and 38B connected to the wiring layers 37A and 37B are formed inside the openings 53A and 53B.

Next, as shown in FIG. 13B, reduced-pressure CVD is used to form a high-resistance or non-doped (insulating) polysilicon film 56 having a low impurity concentration, including the surface of the polysilicon film 54 of the beam shape. Then, this polysilicon film 56 is patterned to make the beam shape. The high-resistance or insulating polysilicon film 56 is also formed inside the opening 55 where the low-resistance polysilicon film of the lower layer is divided in two. In this way, the beam is formed to have two layers of the polysilicon films 54 and in which the center portion of the polysilicon film 54 of the lower layer is integrally formed with the polysilicon film 56 of the upper layer. Specifically, the beam 36 is formed including a first layer film 361 made of the polysilicon film 54 and a second layer film 362 made of the polysilicon film 56.

Next, as shown in FIG. 13C, the sacrifice layer 52 is removed by wet etching using fluoric acid to obtain the microresonator 301 of a cavity structure in which the space 35 is formed between the input and output electrodes 33, 34 and the beam 36.

According to each of the microresonators of the above-described embodiments, since the portion of the beam 36 corresponding to the interval between the input and output electrodes is formed with high-resistance or insulating material, signal leaks through the parasitic capacitance C1 between the input electrode 33 and the beam 36 and parasitic capacitance C2 between the output electrode 34 and the beam 36 are reduced. Hence, frequency difference between the resonance peak and anti-resonance peak can be set widely, and a band-pass filter of a wide bandwidth can be manufactured when this microresonator is applied to the band-pass filter.

Another embodiment of the present invention is a band-pass filter configured to have each of the microresonators 301 through 307 according to the above-described embodiments. Specifically, the band-pass filter is provided by interconnecting microresonators which have different resonance frequencies. The band-pass filter can be formed by using the above-described ladder-type filter shown in FIG. 16 and a lattice-type filter shown in FIG. 17. In the ladder-type filter, a series resonator and a shunt resonator may be formed by arranging a plurality of microresonator elements according to the above-described embodiments in parallel.

Figure 17:
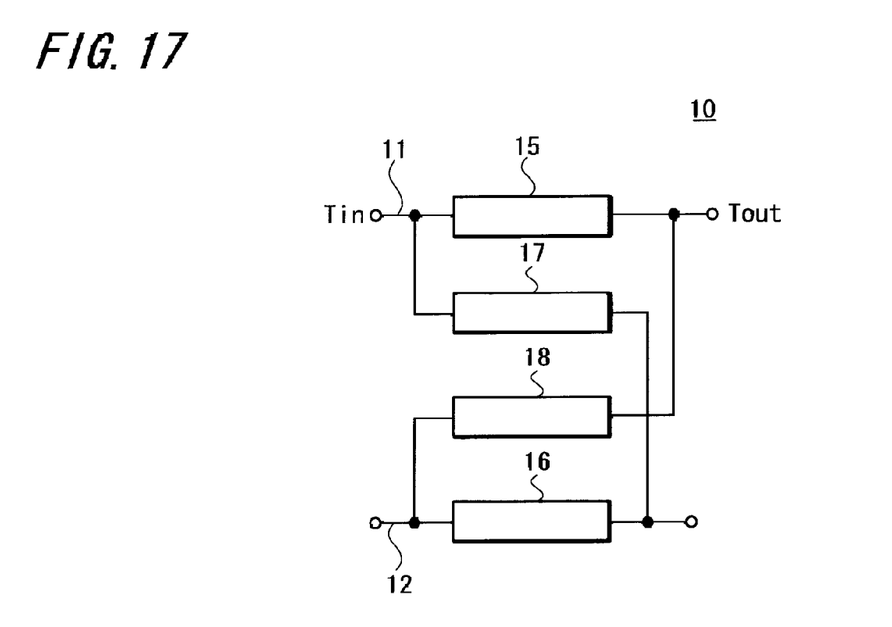
FIG. 17 is a circuit diagram showing an example of a lattice-type filter.

As shown in FIG. 17, the lattice-type filter is configured to have resonators 15 and 16 having the same high-resonance frequency are connected to a signal line 11 and a ground line 12 respectively. Further, resonators 17 and 18 having the same low-resonance frequency are connected respectively between an input side of the resonator 15 on the side of the signal line 11 and an output side of the resonator 16 on the side of the ground line 12 and between an input side of the resonator 16 on the side of the ground line 12 and an output side of the resonator 15 on the side of the signal line 11. Each of the resonators 15 though 18 can be formed by arranging a plurality of microresonator elements of the above-described embodiments in parallel. In this lattice-type filter also, a bandwidth of the filter can be broadened by widely setting the frequency difference between the resonance peak and anti-resonance peak of the resonator.

According to the band-pass filter of this embodiment, since the band-pass filter is configured to have the resonators of the above-described embodiments, signal leaks through the parasitic capacitance C1, C2 in the resonator are suppressed and the frequency difference between the resonance peak and anti-resonance peak of the resonator can be set widely, and so the band-pass filter of the wide bandwidth can be formed. Note that, the ladder-type filter is more suitable for forming a band-pass filter of wide bandwidth.

According to another embodiment of the present invention, a signal filter, mixer, resonator, oscillator, and a SiP (System in Package) device module and a SoC (System on Chip) device module and other semiconductor devices using these are provided using each of the above-described micro-oscillator elements.

According to the semiconductor device of this embodiment, since the microresonator including the above-described microresonator elements, in which signal leaks through the parasitic capacitance are suppressed, is used as a resonator constituting the semiconductor device, a highly reliable semiconductor device that has an excellent characteristic can be provided.

Figure 14:
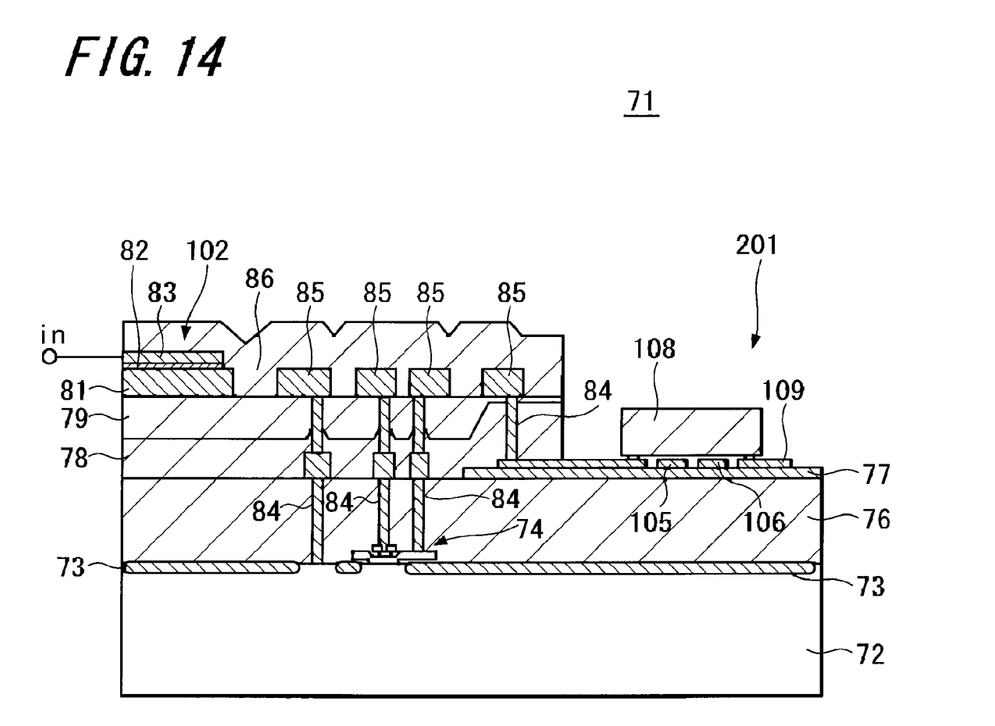
FIG. 14 is a cross-sectional view showing a relevant part of a semiconductor device according to an embodiment of the present invention.

FIG. 14 shows a cross-section of a specific example of a semiconductor device including: a microresonator according to an embodiment of the present invention, a protective capacitor connected to a signal input line side of this resonator and an amplifier that functions as a buffer connected to a signal output line side thereof. In a semiconductor device 71 of this embodiment, a field insulating layer 73 is formed on a main surface of a silicon semiconductor substrate 72 by selective oxidation (LOCOS). Further, an amplifier 74 made of a MOS transistor that functions as a buffer and other circuit elements are formed in a region divided by the field insulating layer 73. An inter-layer insulating film 76 made of a silicon oxide film ($SiO_2$) is formed on the semiconductor substrate 72. A silicon nitride film (SiN) 77 is formed on a part of the inter-layer insulating film 76. Further, a microresonator 101 of the above-described embodiment of the present invention configured to have an input electrode 105, an output electrode 106, a beam 108 and wiring layers 109 is formed on this silicon nitride film 77. Furthermore, a protective capacitor 102 is formed with insulating films 78 and 79 in between. This capacitor 102 is formed of: a lower electrode 81 that also serves as a signal input line, a dielectric film 82 and an upper electrode 83 that also serves as a signal input line. The amplifier 74 and the wiring layer 109 connected to the beam 108 of the microresonator 101 are respectively connected to upper electrodes 85 through conductive layers 84 that penetrate the interlayer insulating film. An insulation protective film 86 is formed as an uppermost layer. Although not illustrated in this figure, the lower electrode 81 of the capacitor 102 is connected to the input electrode 105 of the microresonator 101 and the output electrode 106 of the microresonator 101 is connected to a signal output line.

The microresonator according to the above-described embodiments can be used as a band signal filter such as a high frequency (RF) filter and an intermediate frequency (IF) filter.

According to an embodiment of the present invention, the filter including the microresonator of the above-described embodiments is used to provide a communication apparatus such as mobile phone units, wireless LAN devices, wireless transceivers, television tuners, and radio tuners, which perform communication using electromagnetic waves.

Figure 15:
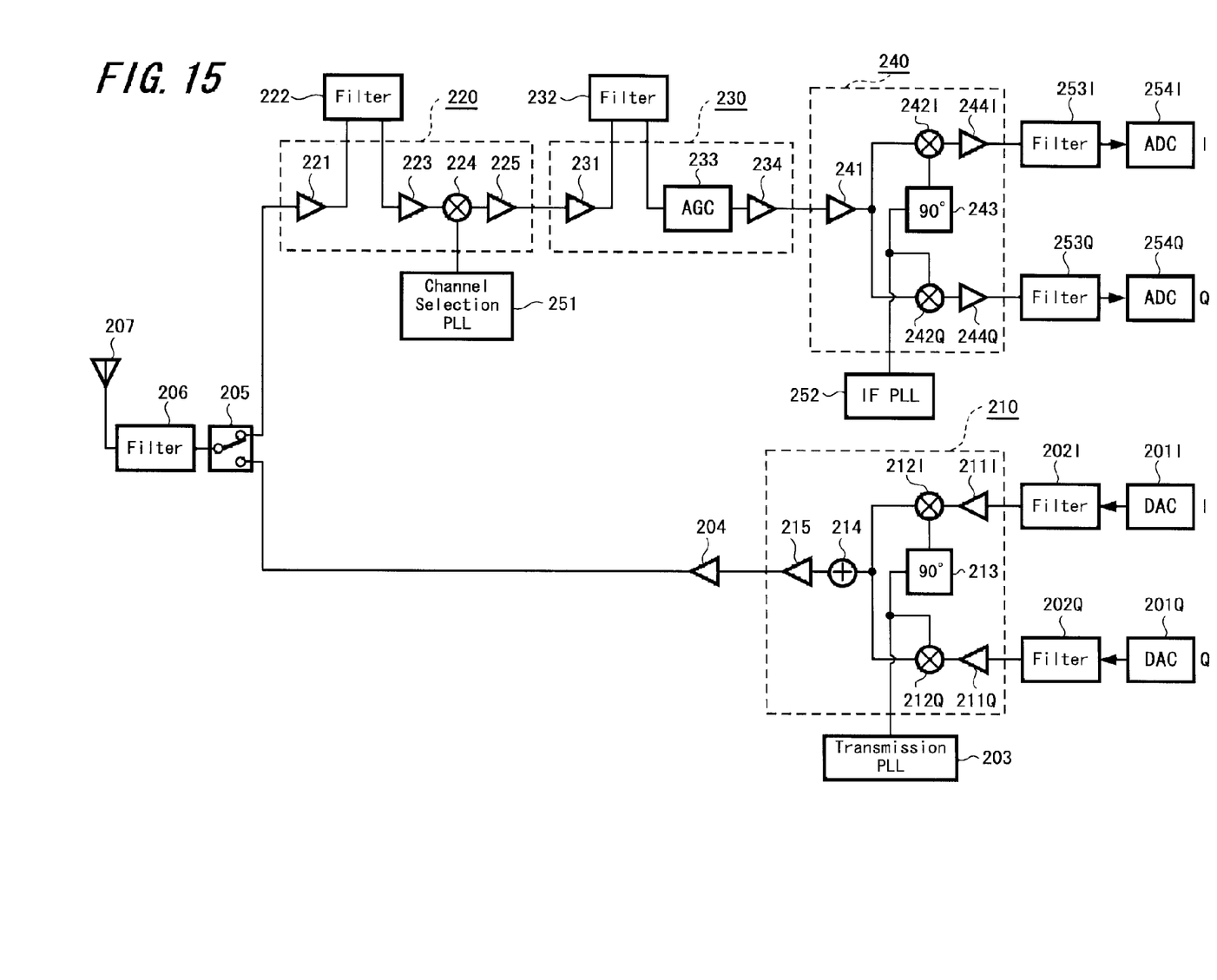
FIG. 15 is a circuit diagram showing a communication apparatus according to an embodiment of the present invention.

Next, referring to FIG. 15, an example of a configuration of a communication apparatus is explained, to which the filter according to an embodiment of this invention is applied.

First, a configuration of a transmission system is explained. Transmission data for I channel and transmission data for Q channel are supplied to digital/analog converters (DACs) 201I and 201Q respectively, and are converted into analog signals. The converted signals for each channel are supplied to band-pass filters 202I and 202Q, signal components of the transmission signals outside the pass band are removed, and the outputs of the band-pass filters 202I and 202Q are supplied to a modulator 210.

In the modulator 210, the signals for each channel are supplied to mixers 212I and 212Q via buffer amps 211I and 211Q, and are mixed with frequency signals corresponding to the transmission frequency supplied from a transmission PLL (phase-locked loop) circuit 203 to be modulated. The mixed signals for each channels are added by an adder 214 to obtain a single series of transmission signals. In this case, the frequency signals supplied to the mixer 212I are phase-shifted by 90° by a phase-shifter 213, and so the I-channel signals and Q-channel signals are quadrature-modulated.

The output of the adder 214 is supplied to a power amplifier 204 via a buffer amplifier 215, and is amplified to a predetermined transmission power. Signals amplified by the power amplifier 204 pass through a transmission/reception switch 205 and high-frequency filter 206, and are supplied to an antenna 207. From the antenna 207, the signals are wirelessly transmitted. A high-frequency filter 206 is a band-pass filter which removes signal components outside the frequency band for transmission and reception by this communication apparatus.

As a configuration of a reception system, signals received by the antenna 207 are supplied to a high-frequency portion 220 via the high-frequency filter 206 and transmission/reception switch 205. In the high-frequency portion 220, after being amplified by a low-noise amplifier (LNA) 221, received signals are supplied to a band-pass filter 222, where signal components outside the reception frequency band are removed. The signals with these components removed are then supplied to a mixer 224 via a buffer amplifier 223. After frequency signals supplied from a channel selection PLL circuit 251 are mixed, signals for the predetermined transmission channel are made to be intermediate-frequency signals, and these intermediate-frequency signals are supplied to an intermediate-frequency circuit 230 via a buffer amplifier 225.

In the intermediate-frequency circuit 230, the supplied intermediate-frequency signals are supplied to a band-pass filter 232 via a buffer amplifier 231, and signal components outside the band of the intermediate-frequency signals are removed. After this removal, the signals are supplied to an automatic gain control (AGC) circuit 233 to obtain signals with substantially constant gain. After gain adjustment performed in the automatic gain control circuit 233, the intermediate-frequency signals are supplied to a demodulator 240 via a buffer amplifier 234.

In the demodulator 240, the supplied intermediate-frequency signals are supplied to mixers 242I and 242Q via a buffer amplifier 241 and are mixed with frequency signals supplied from an intermediate-frequency PLL circuit 252. Thus, the received I-channel signal components and Q-channel signal components are demodulated. In this case, frequency signals which have been phase-shifted 90° by a phase shifter 243 are supplied to the I signal mixer 242I, and the quadrature-modulated I-channel signal component and Q-channel signal component are demodulated.

The demodulated I-channel and Q-channel signals are respectively supplied to band-pass filters 253I and 253Q via buffer amplifiers 244I and 244Q. Signal components other than the signals of the I channel and Q channel are removed, and the signals after the removal are supplied to analog/digital converters (ADCs) 254I and 254Q for sampling and conversion to digital data. Thus, I channel received data and Q channel received data are obtained.

In the configuration described thus far, the filter according to the above-described embodiments can be applied, either in whole or in part, to each of the band pass filters 202I, 202Q, 206, 222, 232, 253I, and 253Q, to limit the pass band.

In the communication apparatus according to an embodiment of the present invention, since the filter including the microresonator according to an embodiment of the present invention is provided as the band-pass filter, an excellent filter characteristic of a wide bandwidth is obtained and a highly reliable communication apparatus can be provided.

In the example of FIG. 15, each filter is configured as a band-pass filter. However, each filter may be configured as a low pass filter to pass only a lower frequency band than a predetermined frequency and a high pass filter to pass only a higher frequency band than a predetermined frequency, and the filter having the configuration according to an embodiment of the present invention is applied to those filters. Here, the example of FIG. 15 is the communication apparatus that performs wireless transmission and wireless reception. However, the filter having the configuration according to the above-described embodiments may be applied to a filter provided in a communication apparatus that performs transmission and reception through a wired transmission path. Furthermore, the filter having the configuration according to the above-described embodiments may be applied to a filter provided in a communication apparatus that performs only transmission processing and in a communication apparatus that performs only reception processing.

It should be understood by those skilled in the art that various modifications, combinations, sub-combinations and alterations may occur depending on design requirements and other factors insofar as they are within the scope of the appended claims or the equivalents thereof.

What is claimed is:

1. A microresonator comprising:
   a beam-type resonator element,
   wherein
   a beam that is an oscillating portion of said resonator element includes a high-resistance portion or an insulating portion, and
   a center portion of said beam corresponding to a node of an oscillation mode has a plurality of parts, such that a center part of the plurality of parts is formed with higher resistance material than that of adjacent parts along a longitudinal direction of said beam.

2. A microresonator according to claim 1, wherein said beam includes at least two layers, and an upper layer and a part of the bottom layer continuous thereto are formed with high-resistance or insulating material.

3. A microresonator according to claim 1, wherein a portion of said beam corresponding to an interval between an input electrode and an output electrode is formed with high-resistance or insulating material.

4. A microresonator according to claim 1, wherein a portion the plurality of parts comprises insulating material.

5. A microresonator according to claim 1, wherein said beam is formed of a plurality of materials each having different resistivity.

6. A microresonator according to claim 1, wherein said beam is formed of a plurality of regions each having different impurity concentration.

7. A band-pass filter comprising: a microresonator which includes a beam-type resonator element according to claim 1.

8. A semiconductor device comprising: a microresonator which includes a beam-type resonator element according to claim 1.

9. A communication apparatus that includes a filter which limits a pass band of transmission signals and/or reception signals, comprising: as said filter a filter based on a microresonator which includes a beam-type resonator element according to claim 1.

* * * * *